United States Patent
Yuasa et al.

(10) Patent No.: US 10,541,645 B2
(45) Date of Patent: Jan. 21, 2020

(54) SOLAR CELL MODULE

(71) Applicant: KYOCERA CORPORATION, Kyoto (JP)

(72) Inventors: Toshiyuki Yuasa, Omihachiman (JP); Kazushi Motonaga, Kyoto (JP); Jun Komada, Omihachiman (JP); Keita Suzuki, Omihachiman (JP)

(73) Assignee: KYOCERA CORPORATION, Kyoto (JP)

( * ) Notice: Subject to any disclaimer, the term of this patent is extended or adjusted under 35 U.S.C. 154(b) by 94 days.

(21) Appl. No.: 15/661,436

(22) Filed: Jul. 27, 2017

(65) Prior Publication Data

US 2017/0324368 A1 Nov. 9, 2017

Related U.S. Application Data

(63) Continuation of application No. PCT/JP2016/052465, filed on Jan. 28, 2016.

(30) Foreign Application Priority Data

Jan. 29, 2015 (JP) ................................. 2015-015760

(51) Int. Cl.
*H02S 30/10* (2014.01)

(52) U.S. Cl.
CPC .................................. *H02S 30/10* (2014.12)

(58) Field of Classification Search
None
See application file for complete search history.

(56) References Cited

U.S. PATENT DOCUMENTS

| 5,578,142 A | 11/1996 | Hattori et al. |
| 2007/0011863 A1* | 1/2007 | Yoshikawa ....... B32B 17/10587 |
| | | 29/592.1 |
| 2010/0263724 A1 | 10/2010 | Tazawa et al. |
| 2011/0023937 A1* | 2/2011 | Daniel .................... E04F 10/08 |
| | | 136/246 |

FOREIGN PATENT DOCUMENTS

| JP | 08-023116 | 1/1996 |
| JP | 08-209855 A | 8/1996 |
| JP | 2000-243998 A | 2/1999 |
| JP | 2009-117728 A | 5/2009 |
| JP | 2012-199284 A | 10/2012 |

OTHER PUBLICATIONS

International Search Report—Written Opinion dated Apr. 2016, in corresponding International Application No. PCT/JP2016/052465 with Statement of Relevance of Non-English References.

* cited by examiner

*Primary Examiner* — Shannon M Gardner
(74) *Attorney, Agent, or Firm* — Duane Morris LLP

(57) ABSTRACT

A solar cell module includes a solar cell panel, a frame member, and an adhesive. The solar cell panel has a front surface, a back surface and a lateral surface. The frame member is located along an outer peripheral part of the solar cell panel, and includes a fitting section with the outer peripheral part fitted therein. The adhesive is located in a space in the fitting section, and bonded to the outer peripheral part. The adhesive includes a pressure-sensitive first adhesive and a curable second adhesive. The curable second adhesive exists at a position different from a position at which the first adhesive exists, in a direction along the longitudinal direction of the frame member.

6 Claims, 5 Drawing Sheets

SOLAR CELL MODULE

CROSS-REFERENCE TO RELATED APPLICATIONS

The present application is a continuation based on PCT Application No. PCT/JP2016/052465 filed on Jan. 28, 2016, which claims the benefit of Japanese Application No. 2015-015760, filed on Jan. 29, 2015. PCT Application No. PCT/JP2016/052465 is entitled "SOLAR CELL MODULE", and Japanese Application No. 2015-015760 is entitled "SOLAR CELL MODULE". The contents of which are incorporated by reference herein in their entirety.

FIELD

Embodiments of the present disclosure relate generally to solar cell modules.

BACKGROUND

In a solar cell module, a frame is provided along the periphery of a solar cell panel. Such a frame includes a concave fitting section. An adhesive is applied to the fitting section, an edge of the solar cell panel is then fitted into the fitting section to fix the frame on the periphery of the solar cell panel. In some techniques, a hot melt sealing agent requiring a short curing time is used as an adhesive.

SUMMARY

A solar cell module is disclosed. In one embodiment, a solar cell module includes a solar cell panel, a frame member, and an adhesive. The solar cell panel has a front surface, a back surface and a lateral surface. The frame member is located along an cuter peripheral part of the solar cell panel, and includes a fitting section with the outer peripheral part fitted therein. The adhesive is located in a space in the fitting section, and bonded to the outer peripheral part. The adhesive includes a pressure-sensitive first adhesive and a curable second adhesive. The curable second adhesive exists at a position different from a position at which the first adhesive exists, in a direction along the longitudinal direction of the frame member.

DETAILED DESCRIPTION

Solar cell modules according to some embodiments of the disclosure will be described in detail below with reference to the drawings.

First Embodiment

Figure 1A:
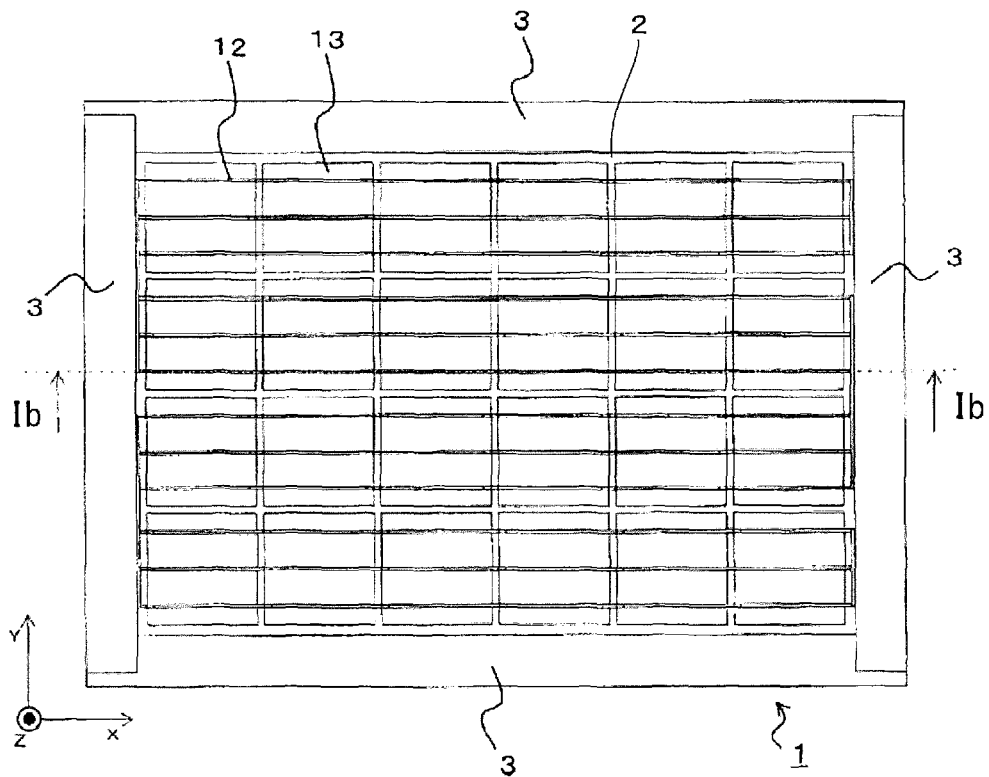
FIG. 1A schematically illustrates a plan view showing one example of an external appearance of a solar cell module according to a first embodiment.
Figure 1B:
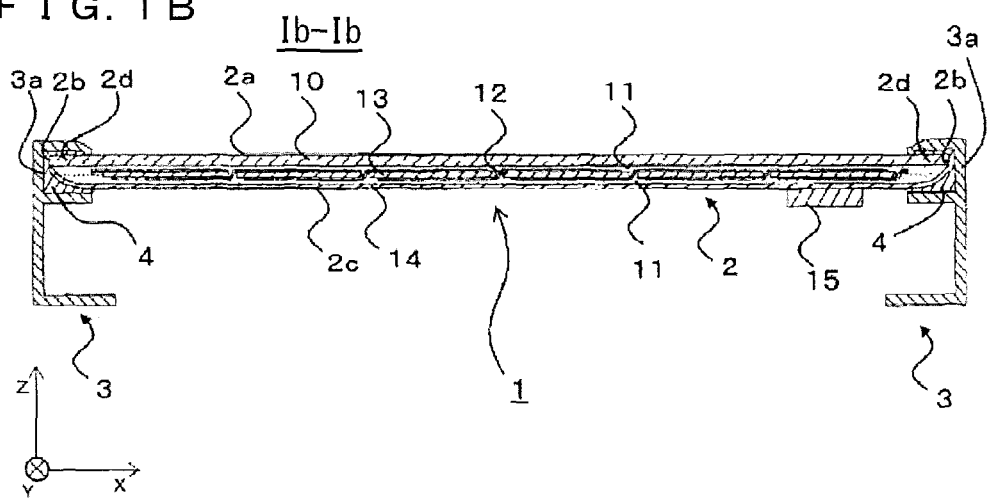
FIG. 1B schematically illustrates one example of a sectional view of the solar cell module which is taken along line Ib-Ib in FIG. 1A.

As shown in FIGS. 1A and 1B, a solar cell module 1 includes a solar cell panel 2 and a plurality of frame members 3. Hereinafter, a direction along one side of the solar cell module 1 having rectangular front and back surfaces is defined as a +X direction, a direction orthogonal to the +X direction and parallel to a front surface 2a of the solar cell panel 2 is defined as a +Y direction, and a direction orthogonal to the +X direction and the +Y direction is defined as a +Z direction as shown in FIGS. 1A and 1B.

The solar cell module 1 includes the solar cell panel 2 having a rectangular surface which principally receives light (also referred to as a light-receiving surface); and a plurality of frame members 3 protecting an outer peripheral part 2d of the solar cell panel 2 and holding the outer peripheral part 2d.

The solar cell panel 2 has a front surface 2a, a lateral surface 2b and a back surface 2c. Specifically, the front surface 2a is a surface of a light-transmissive substrate 10 which is a light-receiving surface. The back surface 2c is a surface of a back surface protecting member 14 located on a side opposite to the front surface 2a. The lateral surface 2b connects between the front surface 2a and the back surface 2c. The solar cell panel 2 includes the outer peripheral part 2d as a section located along an outer periphery existing outside in plan view from the front surface 2a side. Hereinafter, a direction toward the front surface 2a from the back surface 2c of the solar cell panel 2 may be referred to as an upward direction, and a direction toward the back surface 2c from the front surface 2a may be referred to as a downward direction.

The solar cell panel 2 includes the light-transmissive substrate 10, a front surface 2a-side sealing material 11, a plurality of solar cell elements 13 and a back surface 2c-side sealing material 11 in this order from the front surface 2a side. The light-transmissive substrate 10 can protect the front surface 2a side of the plurality of solar cell elements 13, and serves as a substrate of the solar cell module 1. The sealing material 11 contains a thermosetting resin. A plurality of solar cell elements 13 are protected at the periphery by the sealing material 11, and electrically connected by an inner lead 12. The solar cell panel 2 includes a back surface protecting member 14 and a terminal box 15. For example, the back surface protecting member 14 can protect the back surface 2c side of the plurality of solar cell elements 13. For example, the terminal box 15 can extract to the outside a power obtained in the solar cell elements 13.

The light-transmissive substrate 10 has, for example, rectangular front and back surfaces. The light-transmissive substrate 10 can protect the sealing material 11, the inner lead 12 and the solar cell elements 13. As a material of the light-transmissive substrate 10, for example, a tempered glass, a white glass plate or the like can be used.

The inner lead 12 electrically connects adjacent solar cell elements 13. For the inner lead 12, for example, a copper foil covered with a solder for establishing connection with the solar cell elements 13 can be used.

The sealing material 11 seals the solar cell elements 13, the inner lead 12, and so on. Examples of the material of the sealing material 11 include thermosetting resins such as transparent ethylene-vinyl acetate copolymers.

The back surface protecting member 14 has a rectangular shape having the same size as that of the light-transmissive substrate 10. The back surface protecting member 14 can protect the sealing material 11, the inner lead 12 and the solar cell elements 13 from the back surface 2c side. As a material of the back surface protecting member 14, for example, a polyethylene terephthalate resin, a polyethylene naphthalate resin or the like can be used.

The materials of the back surface 2c-side sealing material 11 and the back surface protecting member 14 may be, for example, materials having light-transmissivity. Here, for example, the solar cell element 13 may receive a part of light incident from the back surface 2c side.

For example, the solar cell element 13 includes a flat plate-shaped substrate containing single crystal silicon, polycrystal silicon or the like (also referred to as a crystal silicon substrate). Thus, when as the substrate, for example, a crystal silicon substrate is used, adjacent silicon substrates may be electrically connected by the inner lead 12.

The type of the solar cell element 13 is not particularly limited. As the solar cell element 13, for example, any of a thin-film solar cell element using amorphous silicon, a CIGS solar cell element, a CdTe solar cell element, and a solar cell element with an amorphous thin-film formed on a crystal silicon substrate may be used. The CIGS solar cell element contains a compound semiconductor mainly comprised of four elements: copper (Cu), indium (In), gallium (Ga) and selenium (Se). The CdTe solar cell element contains group II-VI-based compound semiconductor mainly comprised of cadmium (Cd) as a group II (group 12) element and tellurium (Te) as a group VI (group 16) element. The solar cell element 13 may be, for example, one in which at least one of an amorphous silicon layer, a CIGS layer and a CdTe layer is appropriately stacked in combination with a transparent electrode etc. on the light-transmissive substrate 10.

The terminal box 15 includes a box and a power cable. The box is formed of, for example, a modified polyphenylene ether resin or a polyphenylene oxide resin. The power cable is electrically connected to a terminal plate located in a space in the box, so that electric power can be led to the outside of the box.

The frame member 3 is a long member located along the outer peripheral part 2d. The frame member 3 includes a concave fitting section 3a with the edge 2d fitted therein as shown in, for example, FIG. 1B. An adhesive for bonding the outer peripheral part 2d to the frame member 3 is located in a space in the fitting section 3a. Accordingly, the frame member 3 can protect, for example, an outer periphery of the solar cell panel 2.

Figure 3A:
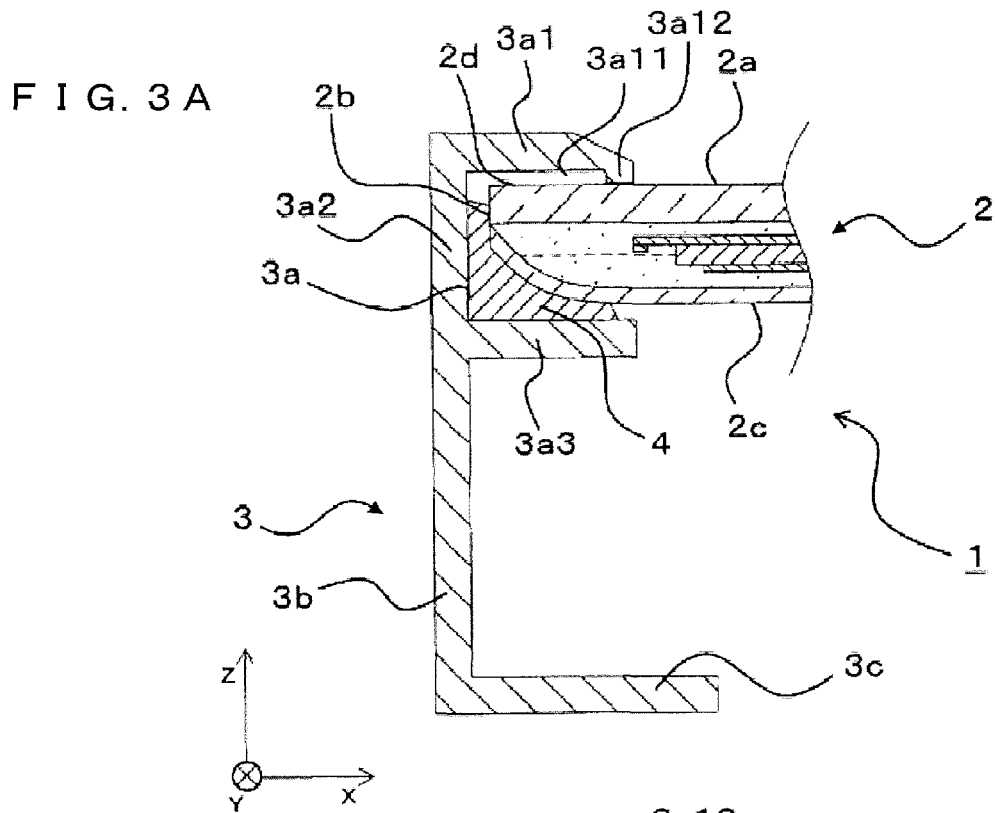
FIG. 3A schematically illustrates one example of a cut section of the solar cell module which is taken along line in FIG. 2.
Figure 3B:
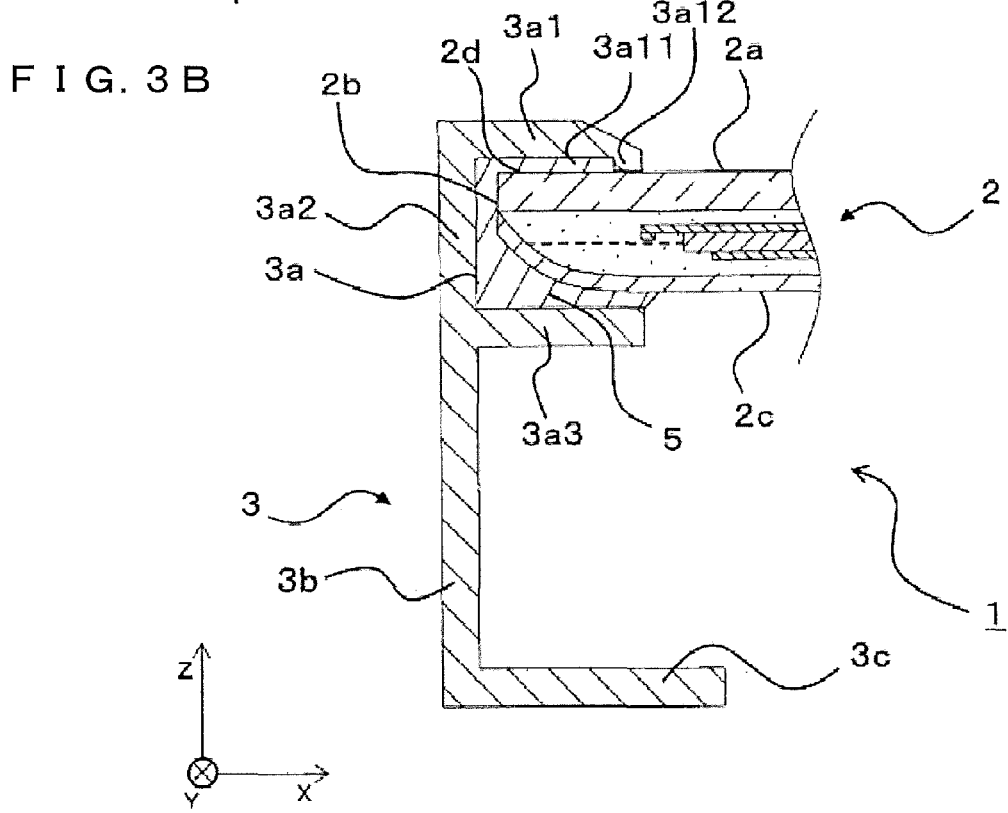
FIG. 3B schematically illustrates one example of a cut section of the solar cell module which is taken along line in FIG. 2.

As shown in FIGS. 3A and 3B, the fitting section 3a of the frame member 3 includes a first wall 3a1 located on the front surface 2a side, a second wall 3a2 located on the lateral surface 2b side, and a third wall 3a3 located on the back surface 2c side. Accordingly, the fitting section 3a has a C-shaped cross-sectional shape. For example, the fitting section 3a has an opening having a width slightly larger than the thickness of the solar cell panel 2. For example, the frame member 3 may include an outer wall 3b located so as to extend downward from the fitting section 3a. For example, the frame member 3 may have a bottom surface 3c located so as to protrude inward (e.g. in a +X axis direction) from the lower end of the outer wall 3b in a direction substantially parallel to the back surface 2c.

In a first embodiment, two adhesives (a first adhesive 4 and a second adhesive 5) having different properties are used as adhesives.

For example, the first adhesive 4 can bond adherends when brought into contact with the adherends by applying a pressure at normal temperature. The first adhesive 4 is, for example, a pressure-sensitive adhesive having tackiness, and having a so-called pressure-sensitive nature. For example, the pressure-sensitive adhesive is also called a tackifier, and has an adhesive force at normal temperature. For example, the first adhesive 4 can bond the solar cell panel 2 to the frame 3 when the solar cell panel 2 is pressed and fitted into a space in the fitting section 3a at which the first adhesive 4 is located. Accordingly, the solar cell panel 2 is held in a space in the fitting section 3a. Here, for example, the outer peripheral part 2d of the solar cell panel 2 is sealed with the first adhesive 4 in a space in the fitting section 3a. As shown in FIG. 3A, the first adhesive 4 is located so as to extend from a section between the solar cell panel 2 and the second wall 3a2 to a section between the solar cell panel 2 and the third wall 3a3 in a space in the fitting section 3a. Here, as one aspect, for example, the first adhesive 4 is located on a downward direction side of the solar cell panel 2. As a material of the first adhesive 4, for example, a butyl rubber-based seal material having excellent weather resistance can be used. As a material of the first adhesive 4, for example, a urethane-based or acryl-based seal material may be used.

The second adhesive 5 is a curable adhesive which is cured by condensation, polymerization, crosslinking or the like to exhibit an adhesive force. As the second adhesive 5, for example, a curable adhesive such as a moisture-curable adhesive, a curing agent-mixed adhesive, a photocurable adhesive, a heat-curable adhesive or an anaerobically curable adhesive can be used. For example, the moisture-curable adhesive can be cured by reacting with moisture in air. The curing agent-mixed adhesive can be cured by mixing a main agent with a curing agent. As the photocurable adhesive, for example, an ultraviolet-curable adhesive which is cured by undergoing a chemical reaction caused by energy of an applied ultraviolet ray can be used. For example, the second adhesive 5 is formed into, for example, an elastic body by passing through a process in which the adhesive is cured by the chemical reaction to be solidified from a liquid form. For example, the second adhesive 5 exhibits a higher adhesive force under a high-temperature condition as compared to the first adhesive 4. Accordingly, position displacement of the solar cell panel 2 hardly occurs in a space in the fitting section 3a even when the solar cell module 1 is exposed to a high-temperature environment. Thus, in the first embodiment, for example, the second adhesive 5 can strongly hold the solar cell panel 2 with the frame member 3. Here, for example, the moisture-curable adhesive does not require special equipment for curing the adhesive. Accordingly, it is easy to manage a step of bonding the solar cell panel 2 to the frame member 3. As a result, productivity of the solar cell module 1 can be improved. Here, for example, a curing agent-mixed adhesive and a photocurable adhesive can be produced by simpler equipment as compared to a heat-curable or anaerobically curable adhesive, and is more easily brought into a semi-solid state with the viscosity increasing more quickly as compared to a moisture-curable adhesive. Accordingly, for example, use of a curing agent-mixed adhesive and a photocurable adhesive can shorten a tact time (pitch) in a step of attaching the frame member 3 to the solar cell panel 2. Thus, productivity of the solar cell module 1 can be further improved. Here, for the material of the second adhesive 5, for example, a one-liquid silicone-based adhesive as a moisture-curable adhesive, a two-liquid curable silicone-based adhesive as a curing agent-mixed adhesive, or a silicone-based adhesive as an ultraviolet-curable adhesive can be used. The second adhesive 5 is not limited to a silicone-based adhesive having excellent weather resistance, and may be, for examples, a urethane-based or epoxy-based adhesive.

Arrangement of the first adhesive 4 and the second adhesive 5 in a space in the fitting section 3a will now be described.

Figure 2:
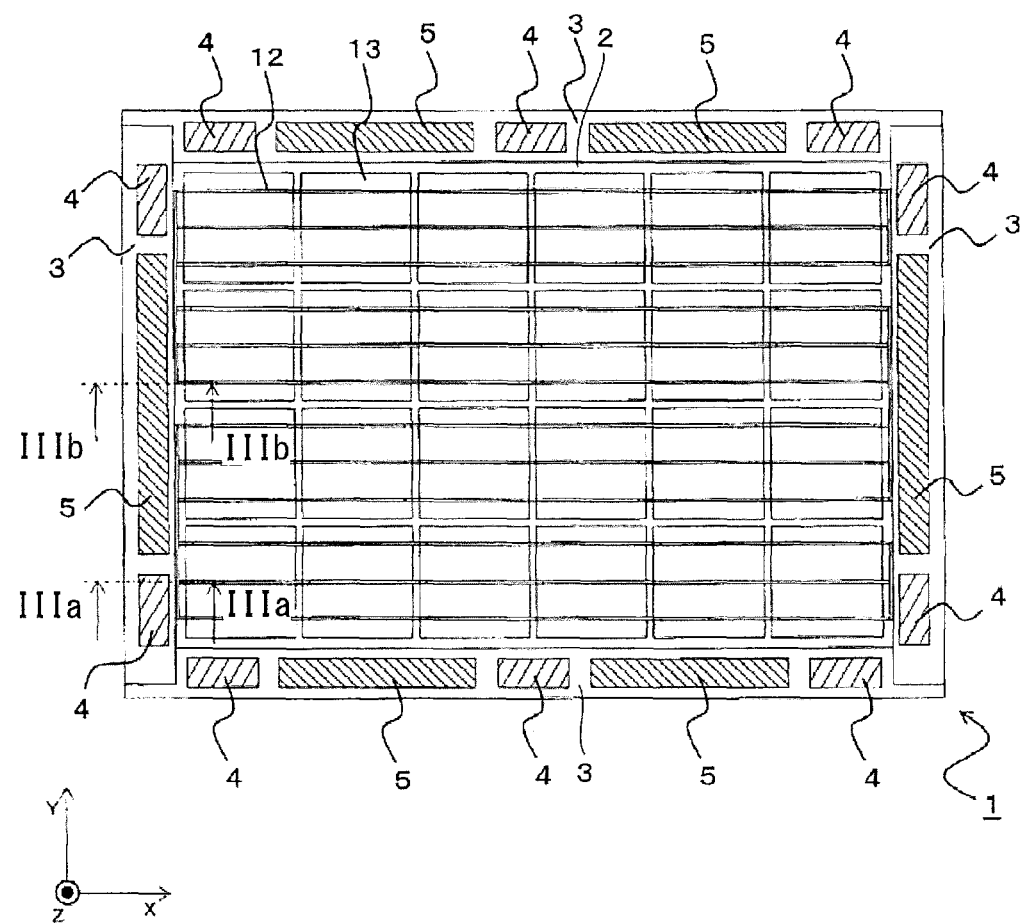
FIG. 2 schematically illustrates a distribution diagram in which one example of a distribution of a first adhesive and a second adhesive each located in a space in a fitting section of a frame member is superimposed on the plan view of the solar cell module shown in FIG. 1A.

The first adhesive 4 and the second adhesive 5 exist at mutually different positions in a direction along the longitudinal direction of the frame member 3 in a space in the fitting section 3a. For example, in the frame member 3 with a +X direction as its longitudinal direction, the first adhesive 4 may be located linearly at three positions including both end positions and a center position in the longitudinal direction in a space in the fitting section 3a of the frame member 3 as shown in FIG. 2. Here, for example, the second adhesive 5 is located between adjacent adhesives 4 in the longitudinal direction of the frame member 3 in a space in the fitting section 3a of the frame member 3. In the frame member 3 with a +Y direction as its longitudinal direction, the first adhesive 4 may be located linearly at two positions including both end positions in the longitudinal direction of the frame member 3 in a space in the fitting section 3a of the frame member 3. Here, for example, the second adhesive 5 is located between adjacent adhesives 4 in the longitudinal direction of the frame member 3 in a space in the fitting section 3a of the frame member 3. Here, for example, in a space in the fitting section 3a of the frame member 3, the length of a portion at which the first adhesive 4 is located (longitudinal-direction length of a region where the first adhesive 4 is located) may be made smaller than the length of a portion at which the second adhesive 5 is located. Here, for example, when in the longitudinal direction of the frame member 3, the first adhesives 4 are located at two or more positions for one frame member 3, the solar cell panel 2 is easily fixed stably at a predetermined position in a space in the fitting section 3a. Accordingly, in the first embodiment, for example, such a failure may hardly occur that the second adhesive 5 is cured with the outer peripheral part 2d inclined with respect to the frame member 3 in a space in the fitting section 3a. As a result, for example, the quality of the solar cell module 1 can be maintained. Here, in particular, for example, the first adhesives 4 may be located at least at both ends of the frame member 3 for one frame member 3.

A method for bonding the solar cell panel 2 to the frame member 3 will now be described.

First, the first adhesive 4 and the second adhesive 5 are applied at a desired position in a space in the fitting section 3a of the frame member 3. Here, for example, the first adhesive 4, the second adhesive 5 and the frame member 3 may be heated beforehand for reducing the viscosity of the first adhesive 4 and the second adhesive 5 to facilitate application of the adhesives.

Next, the outer peripheral part 2d is pressed into a space in the fitting section 3a of the frame member 3 to attach the frame member 3 to the solar cell panel 2. Here, by pressing the solar cell panel 2 into the fitting section 3a, the pressure-sensitive first adhesive 4 located in a space in the fitting section 3a is caused to exhibit an adhesive force, so that the solar cell panel 2 is bonded to the frame member 3. On the other hand, by pressing the outer peripheral part 2d into a space in the fitting section 3a, a gap between the surface 2a and the first wall 3a1 (also referred to as a first gap), a gap between the lateral surface 2b and the second wall 3a2 (also referred to as a second gap), and a gap between the back surface 2c and the third wall 3a3 (also referred to as a third gap) are filled with the second adhesive 5. Here, the second adhesive 5 is, for example, a viscous liquid, and therefore flows to fill the gaps. After the second adhesive 5 fills a space in the fitting section 3a, the second adhesive 5 is cured using a predetermined curing method. Accordingly, the solar cell panel 2 and the frame member 3 are strongly fixed.

In the first embodiment, the pressure-sensitive first adhesive 4 and the curable second adhesive 5 are used in combination as described above. Thus, the solar cell panel 2 can be fixed with the solar cell panel 2 positioned in a space in the fitting section 3a by the first adhesive 4 before the second adhesive 5 exhibits an adhesive force. In other words, the solar cell panel 2 can be fixed to the frame member 3 to some extent by the first adhesive 4 before the second adhesive 5 is cured. Accordingly, for example, position displacement of the solar cell panel 2 can be reduced to suppress an excessive decrease in thickness of the second adhesive 5 between the solar cell panel 2 and the frame member 3. Here, a reduction in adhesive strength between the solar cell panel 2 and the frame member 3 can be alleviated. As a result, adhesive strength between the solar cell panel 2 and the frame member 3 with the second adhesive 5 can be maintained. Adhesive strength between the solar cell panel 2 and the frame member 3 with the second adhesive 5 is maintained even if the first adhesive 4 is softened by heat when the solar cell module 1 according to the first embodiment is used under a high-temperature environment in the outdoors.

In the first embodiment, for example, the solar cell panel 2 can be fixed in a space in the fitting section 3a of the frame member 3 by the first adhesive 4 when the outer peripheral part 2d is fitted into the frame member 3. Thus, operations in subsequent steps, such as conveyance, examination and packaging of the solar cell module 1, can be carried out until the second adhesive 5 is cured. As a result, productivity of the solar cell module 1 is improved. In the first embodiment, for example, the first adhesive 4 not only makes it possible to position the solar cell panel 2 and the frame member 3 during production, but also has an adhesive force even after curing of the second adhesive 5. Accordingly, the strength of the solar cell module 1 can be increased.

In the first embodiment, for example, the first wall 3a1 may have a first recess 3a11 on a surface facing the front surface 2a as shown in FIGS. 3A and 3B. For example, the first recess 3a11 extends in the longitudinal direction of the frame member 3. Here, a projection 3a12 located on a part of the first wall 3a1 on the side of the opening of the fitting section 3a is brought into contact with the front surface 2a of the solar cell panel 2 with the first recess 3a11 provided on the first wall 3a1. Accordingly, the second adhesive 5 before curing is hardly pressed out from a space in the fitting section 3a to the outside when the outer peripheral part 2d is fitted into the fitting section 3a. Thus, the front surface 2a is hardly covered with the second adhesive 5 protruding from a space in the fitting section 3a. As a result, in the first embodiment, a reduction in light-receiving area of the solar cell panel 2 by the second adhesive 5 is alleviated.

Here, for example, the first adhesive 4 may be located not in the first gap but in the second gap and the third gap as shown in FIG. 3A. Here, for example, the solar cell panel 2 can be fixed in such a posture that it is pushed up toward the first wall 3a1 in a space in the fitting section 3a. On the other hand, for example, by filling a space in the fitting section 3a with the second adhesive 5 so as to cover the outer peripheral part 2d as shown in FIG. 3B, an adhesive force and a buffer action between the solar cell panel 2 and the frame member 3 can be increased. Accordingly, long-term reliability of the solar cell module 1 can be maintained.

Second Embodiment

Figure 4:
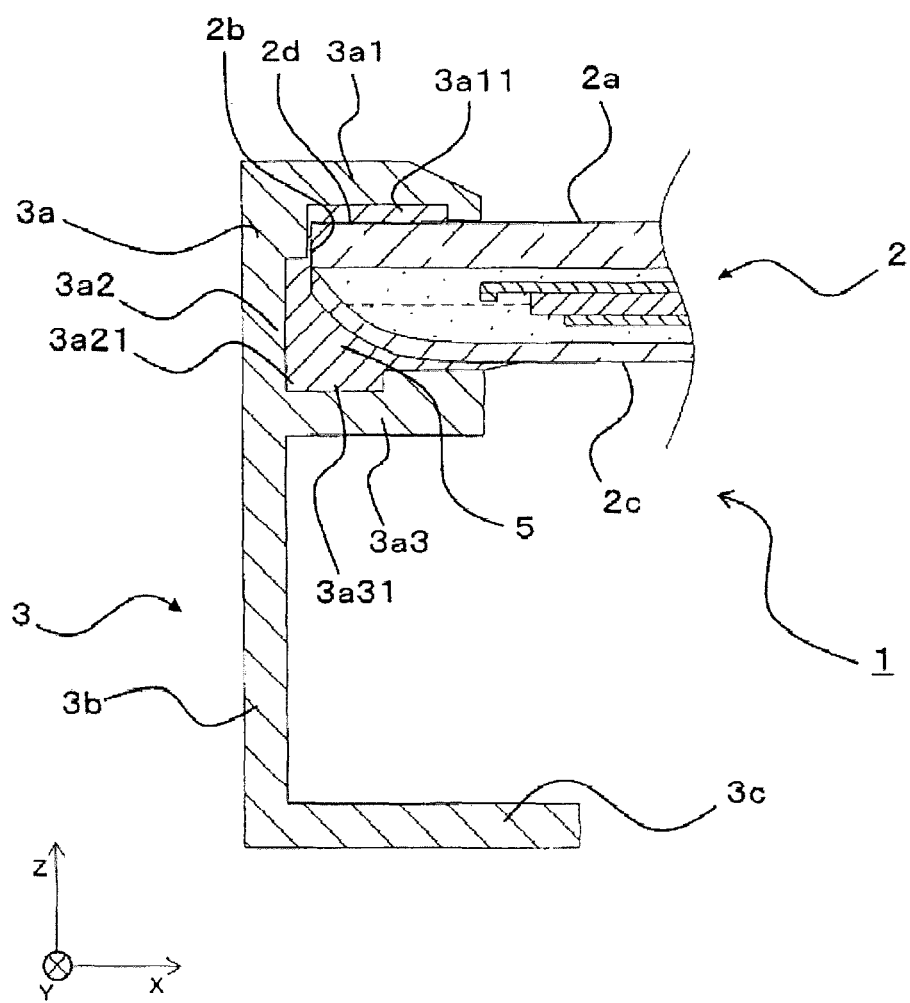
FIG. 4 schematically illustrates one example of a cut section of a solar cell module according to a second embodiment, the cut section corresponding to the cut section in FIG. 3B.

A solar cell module 1 according to a second embodiment is different from the solar cell module 1 of the first embodiment in the structure of a second wall 3a2 and a third wall 3a3 as shown in FIG. 4. In the second embodiment, the second wall 3a2 has a second recess 3a21 on a surface facing a lateral surface 2b of a solar cell panel 2. For example, the second recess 3a21 extends from a position on the second wall 3a2 on the lower side (on the third wall 3a3 side) to a middle position of the second wall 3a2 in a direction from the third wall 3a3 toward a first wall 3a1. For example, a level difference existing at an end of the second recess 3a21 at a middle position on the second wall 3a2 in the vertical direction is located so as to face a lateral surface of a light-transmissive substrate 10 of the solar cell panel 2. For example, the third wall 3a3 has a third recess 3a31 on a surface facing a back surface 2c of the solar cell panel 2. For example, the third recess 3a31 extends from a position on the third wall 3a3 on the second wall 3a2 side to a middle position between the foregoing position and an end of the third wall 3a3. Here, for example, the third recess 3a31 may be coupled to the second recess 3a21 as shown in FIG. 4.

In the second embodiment, the amount of a second adhesive 5 between a frame member 3 and an outer peripheral part 2d can be increased due to existence of the second recess 3a21 and the third recess 3a31. Specifically, for example, existence of the second recess 3a21 increases the thickness of the second adhesive 5 in a +X direction, so that the amount of the second adhesive 5 can be increased. For example, existence of the third recess 3a31 increases the thickness of the second adhesive 5 in a +Z direction, so that the amount of the second adhesive 5 can be increased. Accordingly, for example, adhesive strength between the solar cell panel 2 and the frame member 3 with the second adhesive 5 can be further increased.

Third Embodiment

Figure 5A:
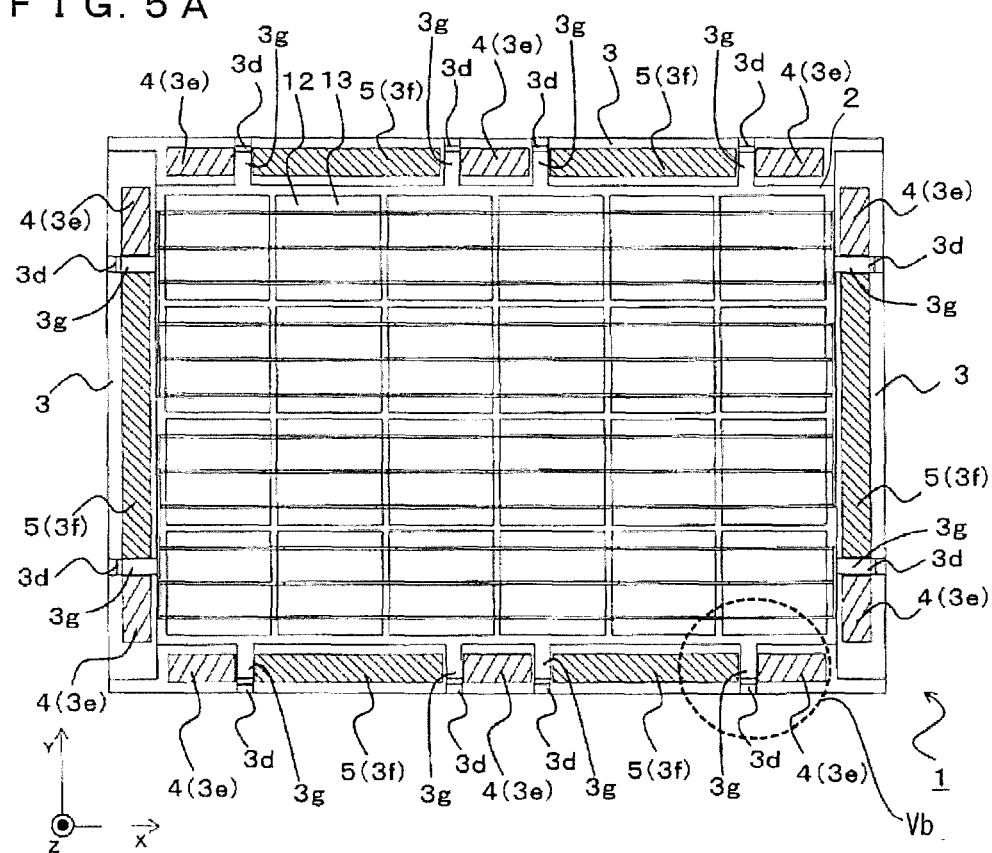
FIG. 5A schematically illustrates a distribution diagram in which one example of a distribution of a first adhesive and a second adhesive each located in a space in a fitting section of a frame member is superimposed on a plan view showing one example of a solar cell module according to a third embodiment.
Figure 5B:
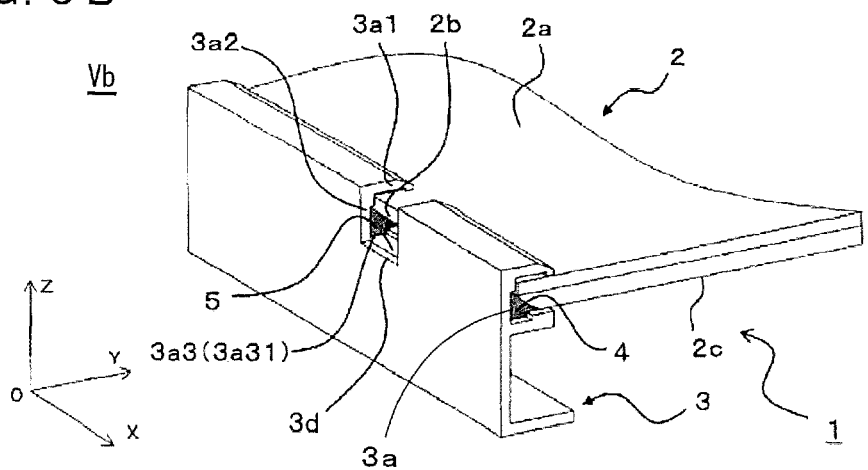
FIG. 5B schematically illustrates an enlarged perspective view showing one example of an external appearance of a part of the solar cell module which corresponds to a Vb part in FIG. 5A.

A solar cell module 1 according to a third embodiment is different from the solar cell modules 1 of the first embodiment and the second embodiment in that the solar cell module 1 according to a third embodiment includes a cutout section 3d in which a first wall 3a1 and a second wall 3a2 are partially cut as FIGS. 5A and 5B. In the third embodiment, a fitting section 3a includes a first region 3e including a first adhesive 4 located in an inner space, a second region 3f including a second adhesive 5 located in an inner space, and a third region 3g including no adhesive located in an inner space. The cutout section 3d is located in the third region 3g of the fitting section 3a, and exists in a state in which a portion extending from the first wall 3a1 to the second wall 3a2 is cut. The cutout section 3d may exist in a state in which a portion extending from the first wall 3a1 to a third wall 3a3 is cut, or exist in a state in which a portion extending from the first wall 3a1 to a part of the third wall 3a3 is cut in the fitting section 3a.

In the third embodiment, for example, rain water retained on a front surface 2a and in a third recess 3a31 can be efficiently discharged through the cutout section 3d. Accordingly, for example, occurrence of contamination on the front surface 2a is reduced. Thus, in the third embodiment, for example, power generation efficiency in a solar cell module 1 can be maintained. In the third embodiment, for example, when the cutout section 3d extends from the first wall 3a1 to the third wall 3a3, water is hardly retained in a third recess 3a31. Accordingly, for example, degradation of a solar cell panel 2 resulting from retention of water in the third recess 3a31 can be reduced.

Thus, in preparation of the solar cell modules 1 according to embodiments, the outer peripheral part 2d of the solar cell panel 2 is fitted into the space in the fitting section 3a of the frame member 3 to bond the frame member 3 to the solar cell panel 2. Here, the solar cell panel 2 is positioned and fixed to the frame member 3 by the pressure-sensitive first adhesive 4 until the curable second adhesive 5 is cured. Accordingly, in embodiments, the second adhesive 5 can be substantially cured during fixation of the frame member 3 by the first adhesive 4. As a result, adhesive strength between the frame member 3 and the solar cell panel 2 with the second adhesive 5 can be sufficiently increased, and productivity of the solar cell module 1 is improved.

The invention claimed is:
1. A solar cell module comprising:
    a solar cell panel having a front surface, a back surface and a lateral surface;
    a frame member which is located along an outer peripheral part of the solar cell panel, and includes a fitting section with the outer peripheral part fitted therein;
    a pressure-sensitive first adhesive located at a first position in a space in the fitting section, and bonded to the outer peripheral part; and
    a curable second adhesive located in the space at a second position different from the first position of the first adhesive in a direction along the longitudinal direction of the frame member, wherein only the first adhesive is located at the first position and only the second adhesive is located at the second position, and wherein each of the first adhesive and the second adhesive is in contact with the outer peripheral part of the solar cell panel and the frame member to bond the outer peripheral part of the solar cell panel to the frame member.
2. The solar cell module according to claim 1, wherein the second adhesive includes a moisture-curable adhesive, a curing agent-mixed adhesive or a photocurable adhesive.
3. The solar cell module according to claim 1, wherein
    the first adhesive is located at least at two positions in the longitudinal direction of the frame member in the space in the fitting section of the frame member, and
    the second adhesive is located between the two adjacent first adhesives in the longitudinal direction of the frame member in the space in the fitting section of the frame member.
4. The solar cell module according to claim 1, wherein
    the fitting section includes a first wall located on the front surface side, a second wall located on the lateral surface side, and a third wall located on the back surface side, and
    the first wall has a surface facing a surface of the solar cell panel and having a first recess which extends in the longitudinal direction of the frame member.

5. The solar cell module according to claim 1, wherein
the fitting section includes a first wall located on the front surface side, a second wall located on the lateral surface side, and a third wall located on the back surface side, and
the first adhesive is not located between the front surface and the first wall, and is located between the lateral surface and the second wall and between the back surface and the third wall.

6. The solar cell module according to claim 4, wherein the fitting section has a second recess located on a surface of the second wall which faces the lateral surface; and a third recess coupled to the second recess and located on a surface of the third wall which faces the back surface.

* * * * *